(12) United States Patent  (10) Patent No.: US 6,667,243 B1
Ramsbey et al.  (45) Date of Patent: Dec. 23, 2003

(54) ETCH DAMAGE REPAIR WITH THERMAL ANNEALING

(75) Inventors: Mark T. Ramsbey, Sunnyvale, CA (US); Nicholas H. Tripsas, San Jose, CA (US); Arvind Halliyal, Cupertino, CA (US); Jeffrey A. Shields, Sunnyvale, CA (US); Yider Wu, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/222,248

(22) Filed: Aug. 16, 2002

(51) Int. Cl.[7] .................. H01L 21/302; H01L 21/461
(52) U.S. Cl. .................. 438/710; 438/709; 438/795; 438/798; 438/906; 438/940; 430/329; 134/1.3
(58) Field of Search ................... 438/704, 706, 438/707, 709, 710, 740, 745, 746, 795, 798, 940, 906; 430/329; 134/1.3

(56) References Cited

U.S. PATENT DOCUMENTS

| 5,543,336 | A | * | 8/1996 | Enami et al. .................. 438/528 |
| 5,958,268 | A | * | 9/1999 | Engelsberg et al. ..... 219/121.84 |
| 6,009,888 | A | * | 1/2000 | Ye et al. ........................ 134/1.3 |
| 6,328,905 | B1 | * | 12/2001 | Lebowitz et al. ............... 216/67 |
| 6,489,590 | B2 | * | 12/2002 | Livshits et al. ......... 219/121.84 |

* cited by examiner

*Primary Examiner*—Richard Elms
*Assistant Examiner*—Beth E. Owens

(57) ABSTRACT

A method of manufacturing a semiconductor device etches a feature on a substrate in accordance with a photoresist mask. The photoresist mask is removed by plasma etching. Laser thermal annealing is performed to vaporize polymer residue created during the stripping of the photoresist mask, and to repair damage to the substrate.

11 Claims, 3 Drawing Sheets

ETCH DAMAGE REPAIR WITH THERMAL ANNEALING

FIELD OF THE INVENTION

The present invention relates to the field of semiconductor processing, and more particularly, to repairinig the etch damage created during semiconductor processing.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realized improved performance and lower costs, as the performance of the MOS transistors increased and as manufacturing costs are reduced.

A typical MOS semiconductor device includes a semiconductor substrate on which a gate electrode is formed over a gate dielectric. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

In creating the MOS transistor or other semiconductor device, the process typically involves a plasma etch process to etch material to form structures. For example, a silicon substrate may have a gate oxide layer or other layer serving as an etch stop layer provided on the top of the silicon substrate. A gate electrode layer, such as polysilicon, is provided on the oxide. A photoresist mask material is deposited and patterned by known photolithography techniques. The plasma etch process is then performed to remove portions of the gate layer that are not protected by the patterned photoresist mask.

After the plasma etch is performed, stopping on the etch stop layer, such as a gate oxide, a gate electrode has been created. The plasma etch, however, damages the etch stop layer and the underlying layers, such as the silicon substrate. The photoresist is rapidly removed in a resist strip process, and pre-diffusion or pre-rapid thermal anneal (RTA) wet cleans are done to remove polymer residue and photoresist. The polymer residue and photoresist must be removed before the damage can be repaired by the thermal anneal process.

The damage to the substrate caused by exposure to the plasma results in the enhanced oxidation of the silicon substrate in subsequent oxidations. The thicker oxide that is formed on the substrate operates to undesirably screen subsequent source/drain implants due to the damage done to the substrate by plasma.

There is a need for an improved process to repair the damage caused to etch stop layers and underlying substrates following a plasma etch process.

SUMMARY OF THE INVENTION

This and other needs are met by embodiments of the present inventions which provide a method of manufacturing a semiconductor device, comprising the steps of etching a feature on a substrate in accordance with a photoresist mask and stripping the photoresist mask by plasma removal. The substrate is laser thermal annealed to repair damage to the substrate.

By the use of laser thermal annealing, following the plasma etch, the polymer residue left over from the stripping of the resist is vaporized by the laser thermal annealing process. Further, the laser thermal annealing repairs the damage to the etch stop layer and underlying layers. This prevents the growth of thick oxide on the previously damaged substrate, thereby avoiding screening during subsequent source/drain implantation steps.

The other stated needs are also met by other embodiments of the present invention which provide a method of forming semiconductor device comprising the steps of forming an etch stop layer on a substrate and forming a gate layer on the etch stop layer. A photoresist mask is created on the gate layer. This gate layer is etched in accordance with the photoresist mask by plasma etching. The photoresist mask itself is removed by plasma etching. Laser thermal annealing is performed to the etch stop layer and the substrate.

The foregoing and other features, aspects and advantages of the present invention will become more apparent from the following detailed description of the invention when taken in conjunction with the accompanying drawings.

DETAILED DESCRIPTION OF THE INVENTION

The present invention addresses and solves problems related to the etching of features of the semiconductor device by plasma etching. These problems include damage to the etch stop layers and to underlying substrates caused by the plasma etching process. The present invention provides for removal of the photoresist by plasma removal after the plasma etch process has been completed. Any polymer residues left after the plasma resist stripping are removed by laser thermal annealing. This laser thermal annealing is performed at an energy level sufficient to vaporize the polymer residues. At the same time, the laser thermal annealing repairs the damage to the etch stop layer and the underlying layers caused by the plasma etching.

Figure 1:
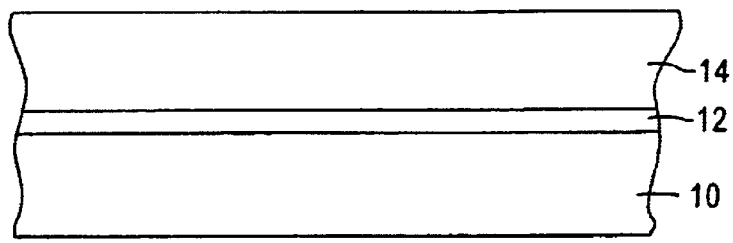
FIG. 1 is a cross-sectional schematic depiction of a semiconductor device during one processing step in accordance with embodiments of the present invention.

FIG. 1 is a schematic cross-sectional depiction of a portion of a semiconductor device during one step of its formation. In the depicted embodiment, a silicon substrate 10 is provided upon which a gate dielectric layer 12, such as a gate oxide, has been provided. The gate oxide may be formed by thermal oxidation, for example, or other technique. As will become apparent in the following description, the gate dielectric layer 12 may also be considered to be an etch stop layer, and will be referred to as such during portions of this description. Also, the gate dielectric layer 12 and the silicon substrate 10 may be considered in combination as a substrate for overlying layers.

An overlying layer 14, such as a polysilicon layer, is provided on a substrate comprising the gate oxide of the gate dielectric layer 12 and the silicon substrate layer 10. This polysilicon layer 14 may be considered a gate layer, since the polysilicon layer 14 will be etched to form a gate electrode. The polysilicon layer 14 may be deposited by any conventional methodology to a desired thickness.

Figure 2:
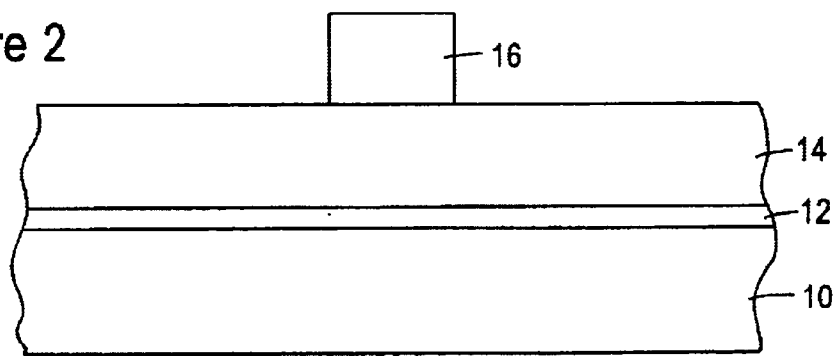
FIG. 2 depicts the structure of FIG. 1 following the deposition and patterning of a photoresist mask layer in accordance with embodiments of the present invention.

FIG. 2 shows the structure of FIG. 1 following the depositing and patterning of a photoresist mask 16. The gate electrode will be defined by the pattern of the photoresist mask 16. Conventional methods of forming the photoresist mask 16 may be employed in the present invention.

Figure 3:
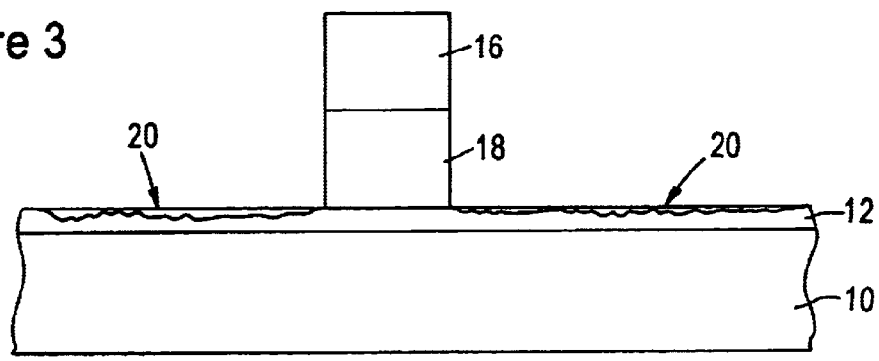
FIG. 3 shows the structure of FIG. 2 following the plasma etching of the gate layer in accordance with embodiments of the present invention.

In FIG. 3, a plasma etch process, which is an anisotrophic etch, has been employed to etch the polysilicon of the polysilicon layer 14. The photoresist mask 16 protects the underlying polysilicon in a polysilicon layer 14. A plasma etch process, which may be any conventional plasma etch process known to those of ordinary skill in the art suitable for etching the material in the particular layer and stopping on the underlying layer, may be employed. A typical plasma etch of polysilicon may be any number of different plasma chemistries. For example, $HBr/Cl_2O_2$ exhibits increased selectivity to silicon dioxide and photoresist in comparison to other etch chemistries. However, in other embodiments, other etch chemistries may be employed without departing from the scope of the invention. Furthermore, different etchants may used in dependence upon the overlying layer 14 and the underlying layers 10, 12, as the invention is not limited to the particular materials employed.

FIG. 3 shows the results of the plasma etch that has been performed, to create the gate electrode 18. The damage regions 20 are indicated. The damage is created by the plasma etch process. Such damage has been typically repaired by rapid thermal annealing following the rapid removal of the photoresist 16 and pre-diffusion or pre-RTA wet cleans that must be done to remove the polymer and the photoresist 16 prior to the rapid thermal annealing. Such steps, in the prior art, increased manufacturing costs and processing steps in the semiconductor manufacturing process.

Figure 4:
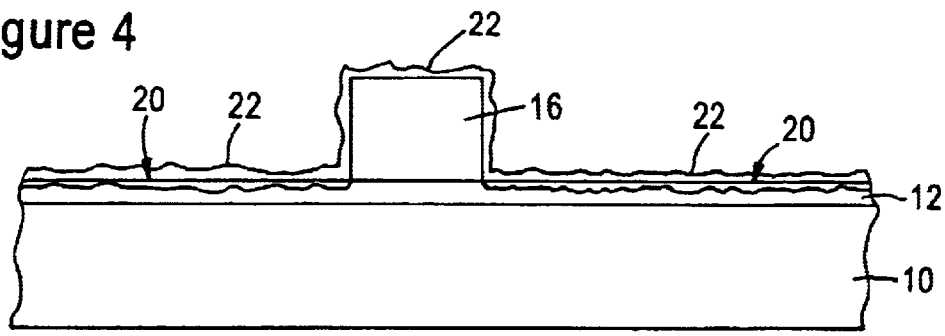
FIG. 4 depicts the structure of FIG. 3 following a plasma etch strip of the photoresist mask material, leaving a residue, in accordance with embodiments of the present invention.

In FIG. 4, the plasma has been employed to strip the resist 16 from the gate electrode 18. However, this has the effect of creating residue 22. This residue 22 needs to be removed prior to the repairing of the damage to the oxide layer 12 and the substrate layer 10. Removal of polymer residue 22 normally requires an aggressive cleaning step.

In the present invention, laser thermal annealing is performed to both remove the polymer residues 22 and to repair the damage caused to the gate oxide 12 and the substrate layer 10. The single step process avoids the extra steps employed in conventional techniques to remove the residues by pre-diffusion or pre-RTA wet cleans performed prior to rapid thermal annealing. The laser thermal etching process vaporizes the polymer residues 22 at the same time it repairs the damage to the etch stop layer formed by the gate oxide 12 and the damage to the underlying silicon substrate layer 10.

Figure 5:
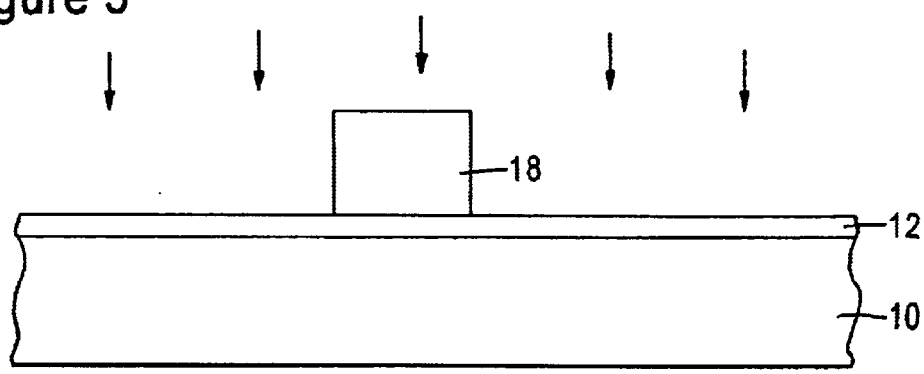
FIG. 5 shows the structure of FIG. 4 during a laser thermal annealing process, in accordance with embodiments of the present invention.

During the laser thermal annealing, the results of which are depicted in FIG. 5, the substrate, formed by the silicon substrate layer 10 and the, oxide layer 12, receives the energy from a laser (not shown). An example of a laser capable of providing this energy is a spatially homogenized 308 nm XeCl pulsed laser. However, the invention is not limited in this manner, and the energy and power of the laser can vary in accordance with different applications. Although not limited in this manner, an exemplary fluence range for laser irradiation can extend from between about 1 $mJ/cm^2$ to about 1.3 $J/cm^2$.

Hence, the present invention acts to vaporize the polymer residues 22 and remove them from the surfaces of the gate electrode 18 and the etch stop layer formed by the gate oxide layer 12 and the gate electrode 18. At the same time, the silicon substrate layer 10 and the gate oxide layer 12 are repaired by the damage caused by the plasma etch process performed earlier. This simultaneous cleaning of residue and repairing of etch damage prevents the use of two separate steps to achieve these goals.

Figure 6:
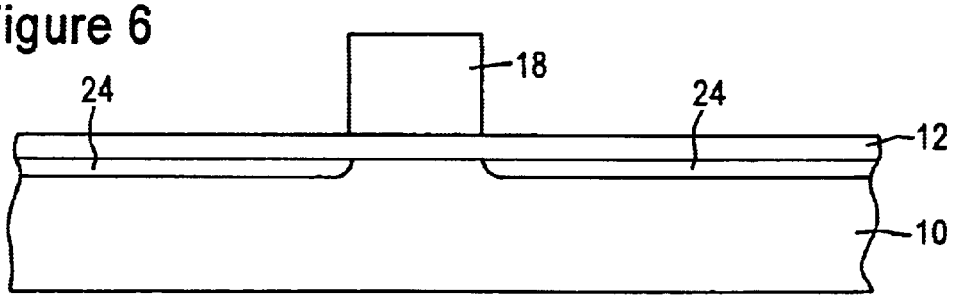
FIG. 6 depicts the structure of FIG. 5 following the shallow implantation of dopants into the repaired substrate, in accordance with embodiments of the present invention.

Following the laser thermal annealing, shallow implants into the repaired silicon substrate layer 10 are provided to create shallow implant regions 24, as shown in FIG. 6. Conventional dopants and ion implant energy levels may be employed, for example, to create the shallow implant regions 24.

Figure 7:
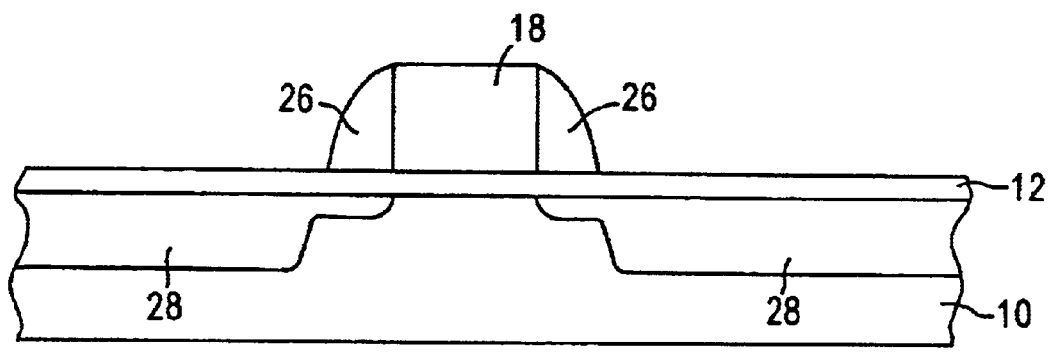
FIG. 7 shows the structure of FIG. 6 following the formation of sidewall spacers and deep implantation of dopants to create source/drain regions in the substrate, in accordance with embodiments of the present invention.

FIG. 7 shows the structure of FIG. 6 after sidewall spacers 26 have been formed on the sides of the gate electrode 18, and deep implants have been made into the silicon substrate layer 10 to create source/drain regions 28.

One of the advantages of the invention is that the silicon substrate 10 is prevented from growing thicker oxide that can screen the source/drain implants. Using laser thermal annealing to repair the damage avoids the undesirable growth of thick oxide on the substrate 10.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of manufacturing a semiconductor device, comprising the steps of:
    etching a feature on a substrate in accordance with a photoresist mask;
    stripping the photoresist mask by plasma removal; and
    laser thermal annealing the substrate to repair damage to the substrate.

2. The method of claim 1, wherein the step of laser thermal annealing is performed at an energy level sufficient to vaporize polymer residue created during stripping of the photoresist mask.

3. The method of claim 2, wherein the substrate comprises a silicon substrate layer and an etch stop layer on the silicon substrate layer.

4. The method of claim 3, wherein the etch stop layer is an oxide layer.

5. The method of claim 4, wherein the laser thermal annealing is performed with a fluence range for laser irradiation between about 1 mJ/cm$^2$ to about 1.3 J/cm$^2$.

6. The method of claim 5, wherein the feature is a gate electrode.

7. The method of claim 6, wherein the step of etching a feature includes plasma etching a layer to form the feature.

8. A method of forming a semiconductor device, comprising the steps of:

forming an etch stop layer on a substrate;

forming a gate layer on the etch stop layer;

creating a photoresist mask on the gate layer;

etching the gate layer in accordance with the photoresist mask by plasma etching;

removing the photoresist mask by plasma etching; and laser thermal annealing the etch stop layer and the substrate.

9. The method of claim 8, wherein the plasma etching creates damage in the etch stop layer and the substrate, and wherein the laser thermal annealing is performed at an energy level sufficient to repair the damage in the etch stop layer and the substrate.

10. The method of claim 9, wherein the laser thermal annealing is performed with a fluence range for laser irradiation between about 1 mJ/cm$^2$ to about 1.3 J/cm$^2$.

11. The method of claim 9, wherein removing the photoresist mask creates polymer residue and wherein the laser thermal annealing is performed at an energy level sufficient to vaporize the polymer residue.

* * * * *